(12) United States Patent
Miyata et al.

(10) Patent No.: US 8,977,927 B2
(45) Date of Patent: Mar. 10, 2015

(54) ERROR-CORRECTION CODING METHOD, ERROR-CORRECTION DECODING METHOD, ERROR-CORRECTION CODING APPARATUS, AND ERROR-CORRECTION DECODING APPARATUS

(75) Inventors: Yoshikuni Miyata, Tokyo (JP); Hideo Yoshida, Tokyo (JP); Kazuo Kubo, Tokyo (JP); Takashi Mizuochi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 84 days.

(21) Appl. No.: 12/778,618

(22) Filed: May 12, 2010

(65) Prior Publication Data

US 2010/0293432 A1 Nov. 18, 2010

(30) Foreign Application Priority Data

May 13, 2009 (JP) ................. 2009-116459

(51) Int. Cl.
*H03M 13/00* (2006.01)
*H03M 13/29* (2006.01)

(52) U.S. Cl.
CPC ..................... *H03M 13/29* (2013.01)
USPC ............. 714/756; 714/752; 714/755

(58) Field of Classification Search
None
See application file for complete search history.

(56) References Cited

U.S. PATENT DOCUMENTS

| | | | |
|---|---|---|---|
| 6,118,825 A | 9/2000 | Ikeda et al. | |
| 7,032,154 B2 * | 4/2006 | Kidorf et al. | 714/755 |
| 7,096,403 B2 * | 8/2006 | Seki | 714/755 |
| 7,146,553 B2 * | 12/2006 | Jarchi et al. | 714/755 |
| 7,289,530 B1 | 10/2007 | Yuan et al. | |
| 7,409,622 B1 * | 8/2008 | Lu et al. | 714/755 |
| 2002/0166091 A1 | 11/2002 | Kidorf et al. | |
| 2004/0025102 A1 * | 2/2004 | Yokokawa et al. | 714/755 |
| 2005/0060635 A1 * | 3/2005 | Eroz et al. | 714/801 |
| 2005/0091565 A1 * | 4/2005 | Eroz et al. | 714/752 |
| 2005/0091570 A1 * | 4/2005 | Eroz et al. | 714/800 |
| 2005/0180525 A1 * | 8/2005 | Hansen et al. | 375/295 |
| 2007/0038912 A1 * | 2/2007 | Hashimoto et al. | 714/755 |
| 2008/0092009 A1 | 4/2008 | Miyata et al. | |
| 2008/0148127 A1 | 6/2008 | Miyata et al. | |
| 2008/0163026 A1 * | 7/2008 | Varnica et al. | 714/755 |
| 2011/0296275 A1 | 12/2011 | Kishigami et al. | |

FOREIGN PATENT DOCUMENTS

JP 2007-259505 10/2007
WO WO 2010-087197 A1 8/2010

OTHER PUBLICATIONS

ITU-T, "Interfaces for the Optical Transport Network (OTN)", International Telecommunication Union, G. 709/Y.1331, pp. 1-109, Mar. 2003.

Y. Miyata et al., OFC/NFOEC 2008, "Efficient FEC for Optical Communications using Concatenated Codes to Combat Error-floor", OTuE4, 2008, pp. 1-3.

* cited by examiner

*Primary Examiner* — Justin R Knapp
(74) *Attorney, Agent, or Firm* — Birch, Stewart, Kolasch & Birch, LLP

(57) ABSTRACT

An error-correction coding method that includes outer coding of performing a coding process for an outer code; and inner coding of performing a coding process for an inner code that has an error correction capability adjusted based on an error correction capability of the outer code.

8 Claims, 5 Drawing Sheets

ERROR-CORRECTION CODING METHOD, ERROR-CORRECTION DECODING METHOD, ERROR-CORRECTION CODING APPARATUS, AND ERROR-CORRECTION DECODING APPARATUS

BACKGROUND OF THE INVENTION

1. Field of the Invention

The present invention relates to an error-correction coding method, an error-correction decoding method, an error-correction coding apparatus, and an error-correction decoding apparatus applied to a digital transmission system and the like.

2. Description of the Related Art

In a conventional error-correction coding method for optical communications, suppression of an error floor(a phenomenon in which a degree of improvement in a bit error rate after correction falls abruptly) is required. In "Y. Miyata, W. Masumoto, H. Yoshida, and T. Mizuochi, "Efficient FEC for optical communications using concatenated codes to combat error-floor," in Proc. OFC/NFOEC 2008, OTuE4, San Diego, Calif., February 2008", a low-density parity-check (LDPC) code (that provides soft-decision decoding with a high error correction capability) is set for an inner code and a Reed-Solomon (RS) code (that provides hard-decision decoding with a relatively low error correction capability) is set for an outer code. The soft-decision decoding with a high error correction capability is performed using the LDPC code and an error floor remaining after the LDPC code is used is eliminated using the RS code. The error correction capability and circuit size are in a trade-off relation, and thus the circuit size associated with the LDPC code is increased in this case.

Because the conventional error-correction coding method and an apparatus therefor are configured as described above, the circuit size for the inner code is adversely increased.

SUMMARY OF THE INVENTION

It is an object of the present invention to at least partially solve the problems in the conventional technology.

An error-correction coding method according to an aspect of the present invention includes outer coding of performing a coding process for an outer code; and inner coding of performing a coding process for an inner code that has an error correction capability adjusted based on an error correction capability of the outer code.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
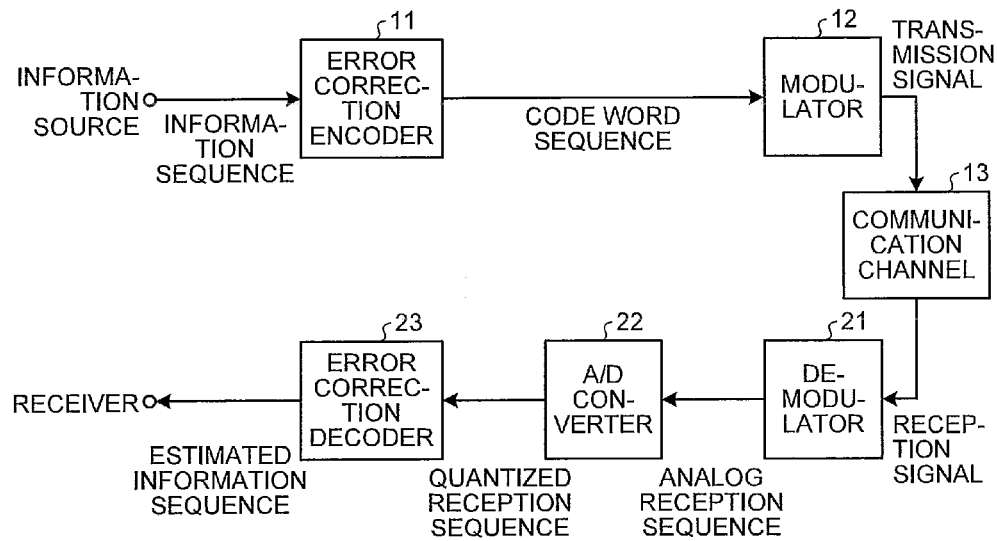
FIG. 1 is a block diagram of a configuration of a digital transmission system according to a first embodiment of the present invention.

FIG. 1 is a block diagram of a configuration of a digital transmission system (hereinafter, simply referred to as "transmission system") that includes an error-correction coding apparatus and an error-correction decoding apparatus according to a first embodiment of the present invention. As shown in FIG. 1, the transmission system includes: an error correction encoder 11 (error-correction coding apparatus) connected to an information source to perform error correction coding for an information sequence and output a code word sequence; a modulator 12 connected to the error correction encoder 11 to modulate the code word sequence and output a transmission signal; a communication channel 13 connected to the modulator 12; a demodulator 21 connected to the modulator 12 through the communication channel 13 to demodulate a reception signal, which is obtained by receiving the transmitted transmission signal, and output an analog reception sequence; an analog/digital (A/D) converter 22 connected to the demodulator 21 to convert the analog reception sequence into a quantized reception sequence; and an error correction decoder 23 (error-correction decoding apparatus) connected to the A/D converter 22 to perform error correction decoding for the quantized reception sequence and output an estimated information sequence. The error correction decoder 23 is connected to a receiver end. The modulator 12, the communication channel 13, the demodulator 21, and the A/D converter 22 have device configurations commonly used in the digital transmission system. The code word sequence output from the error correction encoder 11 is a digital signal, and the transmission signal output from the modulator 12 that receives and modulates the digital signal is an analog signal.

Figure 2:
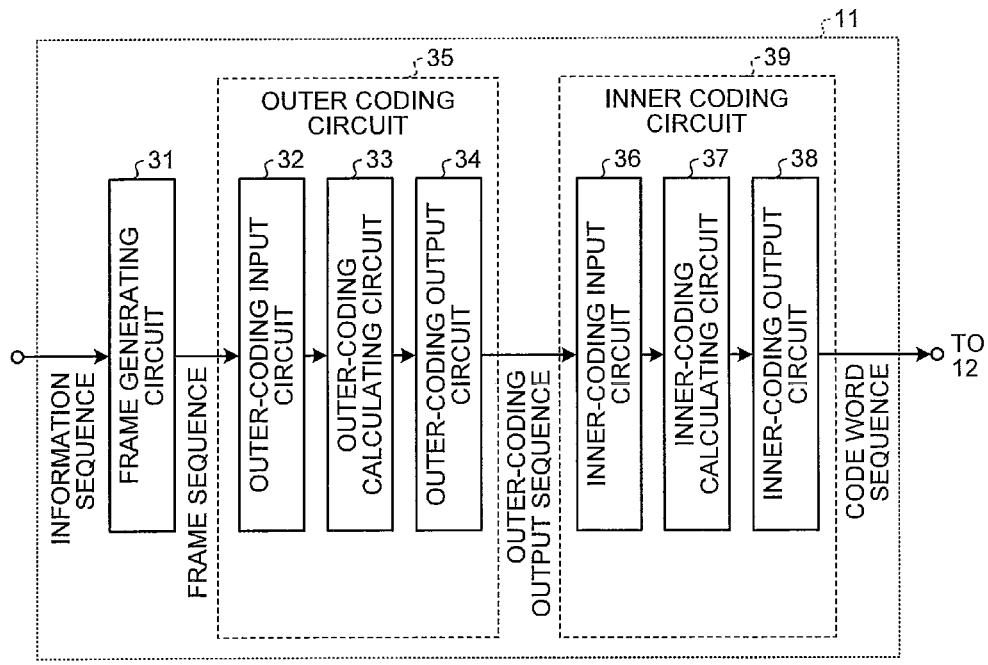
FIG. 2 is a block diagram of a configuration of an error-correction coding apparatus according to the first embodiment.

FIG. 2 is a block diagram of a specific configuration example of the error correction encoder 11 shown in FIG. 1. As shown in FIG. 2, the error correction encoder 11 includes a frame generating circuit 31, an outer-coding input circuit 32, an outer-coding calculating circuit 33, an outer-coding output circuit 34, an inner-coding input circuit 36, an inner-coding calculating circuit 37, and an inner-coding output circuit 38. The outer-coding input circuit 32, the outer-coding calculating circuit 33, and the outer-coding output circuit 34 form an outer coding circuit 35 (coding unit for an outer code). The inner-coding input circuit 36, the inner-coding calculating circuit 37, and the inner-coding output circuit 38 form an inner coding circuit 39 (coding unit for an inner code).

Figure 3:
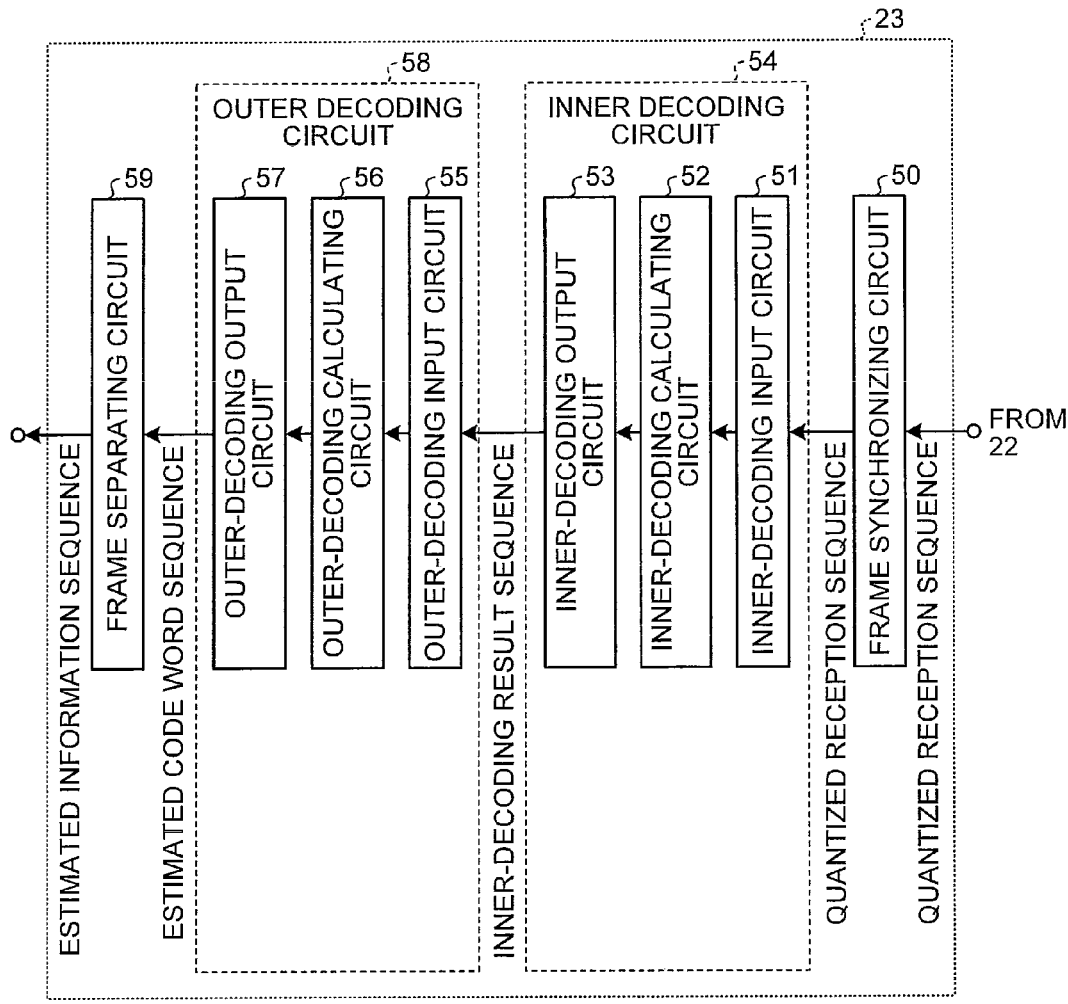
FIG. 3 is a block diagram of a configuration of an error-correction decoding apparatus according to the first embodiment.

FIG. 3 is a block diagram of a specific configuration example of the error correction decoder 23 shown in FIG. 1. As shown in FIG. 3, the error correction decoder 23 includes a frame synchronizing circuit 50, an inner-decoding input circuit 51, an inner-decoding calculating circuit 52, an inner-decoding output circuit 53, an outer-decoding input circuit 55, an outer-decoding calculating circuit 56, an outer-decoding output circuit 57, and a frame separating circuit 59. The inner-decoding input circuit 51, the inner-decoding calculating circuit 52, and the inner-decoding output circuit 53 form an inner decoding circuit 54 (decoding unit for the inner code). The outer-decoding input circuit 55, the outer-decoding calculating circuit 56, and the outer-decoding output circuit 57 form an outer decoding circuit 58 (decoding unit for the outer code).

In FIG. 2, the inner coding circuit 39 is configured to perform an inner coding process for the inner code that has an error correction capability, which is adjusted based on an error correction capability of the outer code. In FIG. 3, the inner decoding circuit 54 is configured to perform an inner decoding process for the inner code that has the error correction capability, which is adjusted based on the error correction capability of the outer code. In FIGS. 2 and 3, functional blocks that perform the inner coding process and the inner decoding process for the inner code having the error correction capability adjusted based on the error correction capability of the outer code are not explicitly shown. Such functions are characteristics of the first embodiment. This is because, in the first embodiment, the error correction capability of the inner code is adjusted based on the error correction capability of the outer code at a specification phase (a circuit design phase), and the inner coding circuit 39 and the inner decoding circuit 54 are configured accordingly. That is, the inner coding circuit 39 and the inner decoding circuit 54 are configured to perform processes associated with the inner code having the error correction capability adjusted based on the error correction capability of the outer code. Details of adjustment on the error correction capability of the inner code are explained later.

An operation of the error correction encoder 11 is explained next. As shown in FIG. 2, an information sequence inputted to the error correction encoder 11 is converted to a predetermined order of frames.

Figure 4:
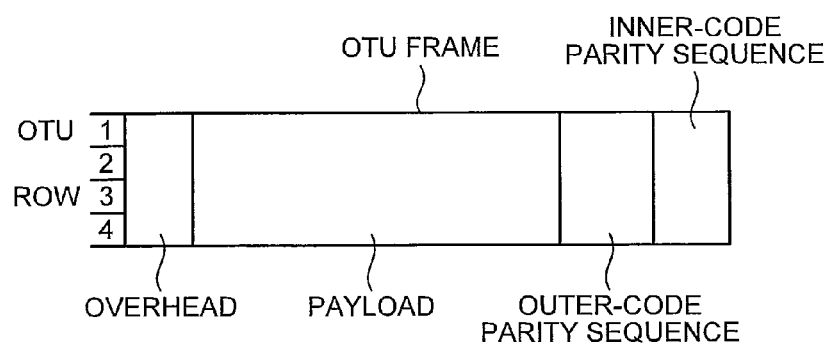
FIG. 4 is a schematic diagram explaining an example of a frame format according to the first embodiment.

When an optical channel transport unit (OTU) frame conforming to ITU-T recommendation G.709, which is normally used in optical communications, is considered for example, this frame has a format as shown in FIG. 4. As shown in FIG. 4, OTU Rows 1 to 4 are arranged, and regions for a control overhead (OH) signal (the length thereof for each Row is 1×16 bytes), a payload corresponding to the information sequence (the length thereof for each Row is 238×16 bytes), and parity sequences for outer and inner codes (the length thereof for each Row is 16×16 bytes in total and optionally is an arbitrary number of bytes) are assigned. Explanations on specific internal arrangement of the regions are omitted.

Incidentally, the frame generating circuit 31 is required when the frame format of the OTU frame or the like is to be considered. However, the frame generating circuit 31 is not always indispensable in a digital transmission system that does not need to consider the frame format and enables to perform sequential coding.

Referring back to FIG. 2, the outer coding circuit 35 then performs an outer coding process (a coding process for the outer code). The outer-coding input circuit 32 performs adjustment of input timing, adjustment of input sequence order (including interleaving) and the like for a frame sequence inputted from the frame generating circuit 31. The outer-coding calculating circuit 33 performs outer coding calculation (generation of an outer-code parity sequence). The outer-coding output circuit 34 performs adjustment of output timing, adjustment of output sequence order (including interleaving) and the like, and outputs an obtained result as an outer-coding output sequence.

Figure 5:
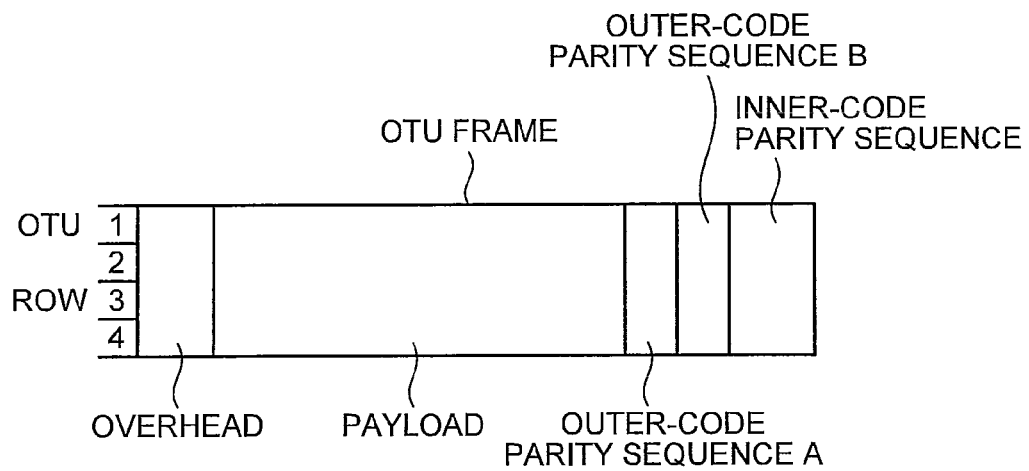
FIG. 5 is a schematic diagram explaining another example of a frame format according to the first embodiment.

Block codes that are suitable for hard-decision decoding and enable to relatively reduce a circuit size, particularly a Bose-Chaudhuri-Hocquenghem (BCH) code, an RS code and the like are suitable for an outer coding method. Furthermore, a concatenated code or a product code, which has a higher error correction capability than a single block code, is particularly suitable in view of the characteristics of the first embodiment. When a concatenated code or a product code is used, a frame has a format as shown in FIG. 5, for example. A configuration example of the concatenated code or the product code is preferably a combination of plural types of block codes such as the BCH code and the RS code. Also, a combination of a block code and a convolutional code can be used.

The number of parallel inputs or outputs, timing adjustment, sequence order adjustment, and the like in the outer-coding input circuit 32 and the outer-coding output circuit 34 vary according to types of the outer code or interleaving method to be applied. The first embodiment is applicable to any type.

Referring back to FIG. 2, the inner coding circuit 39 then performs an inner coding process (a coding process for the inner code). The inner-coding input unit 36 performs adjustment of input timing, adjustment of input sequence order (including interleaving) and the like for the outer coding output sequence inputted from the outer coding circuit 35. The inner-coding calculating circuit 37 performs inner coding calculation (generation of an inner-code parity sequence). The inner-coding output circuit 38 performs adjustment of output timing, adjustment of output sequence order (including interleaving) and the like, and outputs an obtained result as a code word sequence.

Codes suitable for soft-decision decoding, particularly a convolutional code, a convolutional turbo code, a block turbo code, an LDPC code and the like are suitable for an inner coding method.

The number of parallel inputs or outputs, timing adjustment, sequence order adjustment, and the like in the inner-coding input circuit 36 and the inner-coding output circuit 38 vary according to types of the inner code or interleaving method to be applied. The first embodiment is applicable to any type.

A function of the inner coding circuit 39 to adjust the error correction capability is explained later comprehensively.

Information (data) transmitted between the circuits 31 to 39 in the error correction encoder 11 can be configured to be transferred by a pipeline system through a bus that connects the circuits 31 to 39. The information can be alternatively configured to be transferred by provision of a working storage area that can be referred to by a preceding and a subsequent adjacent circuits.

An operation of the error correction decoder 23 is explained. The error correction decoder 23 has a circuit configuration corresponding to the error correction encoder 11, and has a function to decode an error correction code generated by the error correction encoder 11.

As shown in FIG. 3, the frame synchronizing circuit 50 first adjusts a synchronizing timing of predetermined frames in a quantized reception sequence inputted to the error correction decoder 23, and then inputs the adjusted quantized reception sequence to the inner decoding circuit 54.

Incidentally, the frame synchronizing circuit 50 is required when the frame format of the OTU frame or the like is to be considered. However, the frame synchronizing circuit 50 is not always indispensable in a digital transmission system that does not need to consider the frame format and enables to perform sequential coding.

The inner decoding circuit 54 performs an inner decoding process (a decoding process for the inner code). The inner-decoding input circuit 51 performs adjustment of input timing, adjustment of input sequence order (including interleaving) and the like for the quantized reception sequence inputted from the frame synchronizing circuit 50. The inner-decoding calculating circuit 52 performs inner decoding calculation (generation of an estimated code word for the inner code). The inner-decoding output circuit 53 performs adjustment of output timing, adjustment of output sequence order (including interleaving) and the like, and outputs an obtained result as an inner-decoding result sequence.

When a code suitable for soft-decision decoding, such as a convolutional code, is selected as an inner coding method, soft-decision decoding corresponding to the inner coding is performed. Furthermore, when a convolutional turbo code, a block turbo code, or an LDPC code is selected, for example, soft-decision iterative decoding corresponding to the inner coding is performed in the inner decoding process. In the first embodiment, explanations of the quantized reception sequence are given assuming that quantization of q bits per transmitted symbol where q>1, that is "soft-decision" quantization, is performed.

The number of parallel inputs or outputs, timing adjustment, sequence order adjustment, and the like in the inner-decoding input circuit 51 and the inner-decoding output circuit 53 vary according to types of the inner code or interleaving method to be applied. The first embodiment is applicable to any type.

Adjustment on the error correction capability performed in the inner decoding circuit 54 is explained later comprehensively.

Referring back to FIG. 3, the outer decoding circuit 58 then performs an outer decoding process (decoding process for the outer code). The outer-decoding input circuit 55 performs adjustment of input timing, adjustment of input sequence order (including interleaving) and the like for the inner-decoding result sequence inputted from the inner decoding circuit 54. The outer-decoding calculating circuit 56 performs outer decoding calculation (generation of an estimated code word for the outer code). The outer-decoding output circuit 57 performs adjustment of output timing, adjustment of output sequence order (including interleaving) and the like, and outputs an obtained result as an estimated code word sequence.

When a block code suitable for hard-decision decoding, particularly a BCH code or an RS code is selected as an outer coding method, hard-decision bounded distance decoding corresponding to the outer coding is performed in the outer decoding process. When a concatenated code or a product code is used as an outer coding method, hard-decision iterative decoding is preferably performed in view of the characteristics of the first embodiment. It is also possible to output soft-decision information (q' bits per transmitted symbol where q'>1) as an inner decoding result and perform soft-decision iterative decoding for the outer code. It is also possible that an erasure flag (a flag having a value 1 when one transmitted symbol is erased and otherwise having a value 0) is additionally outputted as an inner decoding result to perform decoding based on erasure correction for the outer code. Hard-decision decoding is preferably performed based on hard-decision information (q'=1) in the outer decoding process in view of the characteristics of the first embodiment.

The number of parallel inputs or outputs, timing adjustment, sequence order adjustment, and the like in the outer-decoding input circuit 55 and the outer-decoding output circuit 57 vary according to types of the outer code or interleaving method to be applied. In any type, the first embodiment can be configured.

The frame separating circuit 59 (corresponding to the frame generating circuit 31 at the transmitting end) eliminates bits corresponding to the OH signal and bits corresponding to the parity sequence from the estimated code word sequence. Then, the frame separating circuit 59 outputs an estimated information sequence.

Incidentally, when the frame format of the OTU frame or the like is to be considered, the frame separating circuit 59 is required. However, the frame separating circuit 59 is not always indispensable in a digital transmission system that does not need to consider a frame format and enables to perform sequential coding.

Information (data) transmitted between the circuits 50 to 59 in the error correction decoder 23 can be configured to be transferred in a pipeline system through a bus that connects the circuits 50 to 59. The information can be alternatively configured to be transferred by provision of a working storage area that can be referred to by a preceding and a subsequent adjacent circuit.

The adjustment on the error correction capability performed in the inner coding circuit 39 and the inner decoding circuit 54 is explained.

When a code suitable for soft-decision decoding, particularly a convolutional turbo code, a block turbo code, or an LDPC code, which enables soft-decision iterative decoding, is selected as the inner coding method, an advantage of the code is the high error correction capability in the inner decoding. Conversely, an increased circuit size of the inner decoding circuit 54 causes a problem. The error correction capability and the circuit size usually have a tendency of trade-off. The first embodiment is characterized in optimizing the trade-off.

When a parameter of the inner code is shifted toward a value that provides a higher error correction capability, when a code length n is increased for example, the circuit size of the inner decoding circuit 54 is increased. When the number i of iterations is increased, the circuit size of the inner decoding circuit 54 is also unfavorably increased. Conversely, when the error correction capability is set too low to reduce the circuit size of the inner decoding circuit 54, there are cases where an error floor, which remains after the inner coding, is unfavorably not eliminated.

In the first embodiment, the error correction capability of the inner code is adjusted. Specifically, the error correction capability of the inner code is adjusted based on the error correction capability of the outer code, so that error bits that remains after error correction with the inner code can be corrected with the outer code.

A random error is explained first. Assuming additive white Gaussian noise (AWGN) as channel noise, a bit error ratio (BER) of a channel, BERib, with respect to a signal to noise ratio (SNR) of the channel is defined by the following expression.

$$BER_{ib} = (1/2) Erfc(Sqrt(SNR/2)) \tag{1}$$

where Erfc( ) is a complementary error function commonly known and Sqrt( ) is a square root.

It is assumed that, errors that remain after error correction for errors at BERib by the inner decoding circuit 54 are random. In this case, BER after the inner decoding is indicated as BERid. It is also assumed that desired BER at a point of output of the error correction decoder 23 (that is, after error correction by the outer decoding circuit 58) is indicated as BERod. Then, and a limit value of BER before the error correction by the outer decoding circuit 58, which is required to obtain BERod, is indicated as BERob.

It is required that BERid meets the following conditional expressions.

$$BERid < BERob \quad (2)$$

$$BERob \ll BERib \quad (3)$$

Figure 6:
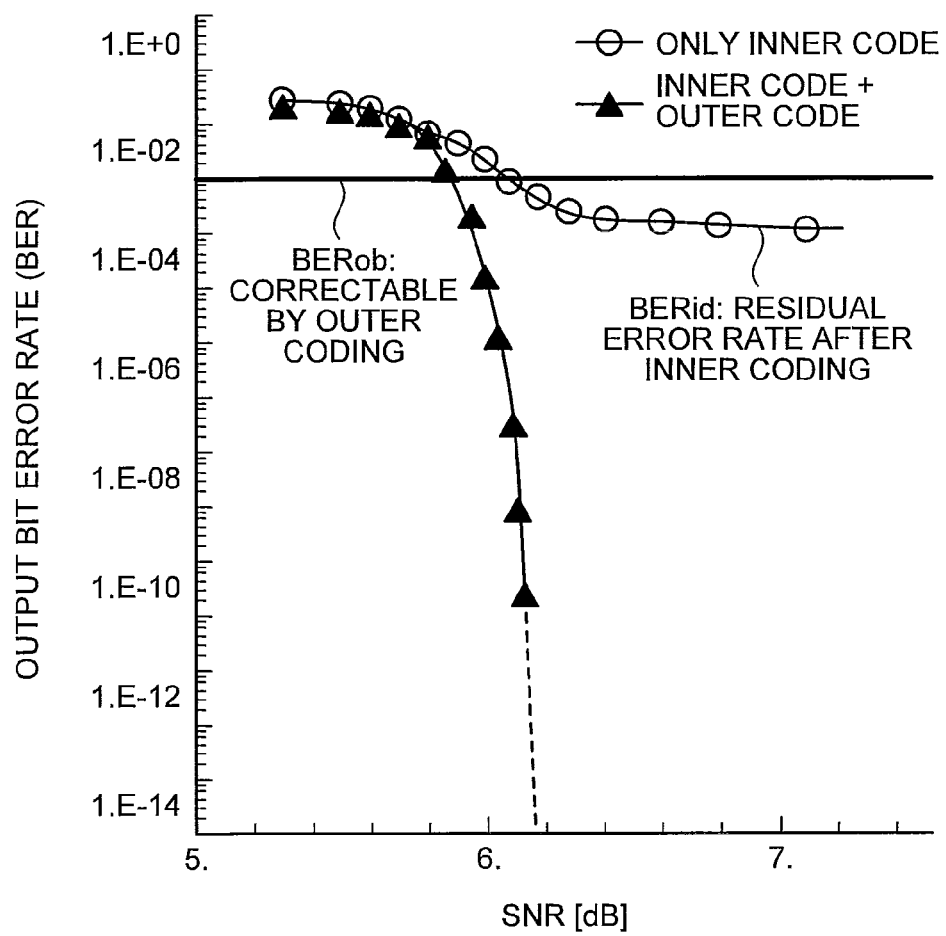
FIG. 6 is a schematic diagram explaining an error-correction-capability adjusting function according to the first embodiment.

FIG. 6 is an example that meets these conditions. It is assumed that, BERid, which is BER after decoding of the inner code, falls abruptly with increase (in a right direction) in SNR on the horizontal axis in FIG. 6. Then, it results in reduction of errors to BERob (indicated by a horizontal bold line), which is BER random errors at which can be corrected with the outer code. In such a case, the inner code has necessary and sufficient error correction capability. Such an inner code is preferably selected. It is desirable that BERib of the inner coding be larger than BERob of the outer coding. That is, when errors at high BER that cannot be corrected with the outer code are corrected with the inner code, reduction of errors to BERob that can be corrected with the outer code can be achieved.

Common parameters associated with the error correction capability include a code length n, a coding ratio r, the number i of iterations, a bit width q of a quantized reception sequence, the number No of outer interleaving depth, and the like. A constraint length K is a parameter for the convolutional code. For the convolutional turbo code, a constraint length K of a component code, and an inner interleaving method, and the like are associated with the error correction capability. For the block turbo code, minimum distances d1 and d2 of component codes, the number Ni of inner interleaving depth, and the like are associated. For the LDPC code, a column weight v of a parity check matrix and a girth g, which is a minimum loop length, in the matrix are associated.

To adjust the error correction capability of the inner code, adjustment for shortening the code length n is performed to reduce the error correction capability, for example. The error correction capability is similarly reduced by performing adjustment to increase the coding ratio r, reducing the number i of iterations, and reducing the number No of outer interleaving depth. While this adjustment reduces the error correction capability of the inner code, it produces effects of reducing the circuit size of the inner coding circuit 39 and the inner decoding circuit 54 and reducing amounts of coding calculation and decoding calculation.

The error correction capability is similarly reduced by reducing the constraint length K, simplifying the inner interleaving, reducing the minimum distances d1 and d2, and reducing the number Ni of inner interleaving depth. While this adjustment reduces the error correction capability of the inner code, it produces the effects of reducing the circuit size of the inner coding circuit 39 and the inner decoding circuit 54, and reducing the amounts of coding calculation and decoding calculation.

The error correction capability is similarly reduced by reducing the column weight v of the parity check matrix and reducing the girth g (which mainly leads to reduction in the code length n). While this adjustment reduces the error correction capability of the inner code, it produces the effects of reducing the circuit size of the inner coding circuit 39 and the inner decoding circuit 54, and reducing the amounts of coding calculation and decoding calculation.

Even when the error correction capability of the inner code is reduced, adjustment meeting the expressions (2) and (3) can provide a necessary and sufficient function of the inner code. Accordingly, the effects of reducing the circuit size of the inner coding circuit 39 and the inner decoding circuit 54 and reducing the amounts of coding calculation and decoding calculation are available. Although an error floor occurs after decoding of the inner code in FIG. 6, the error floor can be eliminated after decoding of the outer code because the expressions (2) and (3) are met.

Adjustment on the error correction capability of the inner code with respect to burst errors is explained. Tendencies (an average frequency P, the number L of residual bits per event, and the like) of residual errors after inner coding are examined based on the error correction capability (related to a minimum distance d), the number No of interleaving depth, and the number C of multiplexed code words of the outer code.

It is checked whether the following condition is satisfied, for example.

$$(L/No) < \mathrm{floor}((d-1)/2) \quad (4)$$

In the expression (4), floor(x) is a maximum integer not exceeding x. It is also checked whether the average frequency P is equal to or smaller than a thousandth of the number C of multiplexed code words, for example. The error correction capability of the inner code is adjusted based on a result of the check to obtain a level correctable by the outer code.

The adjustment on the error correction capability of the inner code as described above can avoid an increase in the circuit size due to assignment of an excessive error correction capability to the inner code.

The function of adjusting an inner-decoding error correction capability to perform the inner coding process and the inner decoding process for the inner code having the error correction capability adjusted based on the error correction capability of the outer code, which is a characteristic of the first embodiment, is determined at a specification phase. Accordingly, the function is already installed in the inner coding circuit 39 and the inner decoding circuit 54 in FIGS. 2 and 3.

As described above, according to the first embodiment, the inner coding circuit 39 is configured to perform the inner coding process for the inner code having the error correction capability adjusted based on the error correction capability of the outer code. The inner decoding circuit 54 is configured to perform the inner decoding process for the inner code having the error correction capability adjusted based on the error correction capability of the outer code. Therefore, the inner coding process and the inner decoding process for the inner code having the error correction capability adjusted based on the error correction capability of the outer code can be achieved. Accordingly, an increase in the circuit size due to assignment of an excessive error correction capability to the inner code can be avoided.

The first embodiment includes the outer coding circuit 35 and the inner coding circuit 39 that performs the inner coding process for the inner code having the error correction capability adjusted based on the error correction capability of the outer code. Therefore, an error-correction coding apparatus that can avoid an increase in the circuit size due to assignment of an excessive error correction capability to the inner code can be realized.

Furthermore, the first embodiment includes the outer decoding circuit 58 and the inner decoding circuit 54 that performs the inner decoding process for the inner code having the error correction capability adjusted based on the error correction capability of the outer code. Therefore, an error-correction decoding apparatus that can avoid an increase in the circuit size due to assignment of an excessive error correction capability to the inner code can be realized.

A second embodiment of the present invention is explained below with reference to the accompanying drawings.

Figure 7:
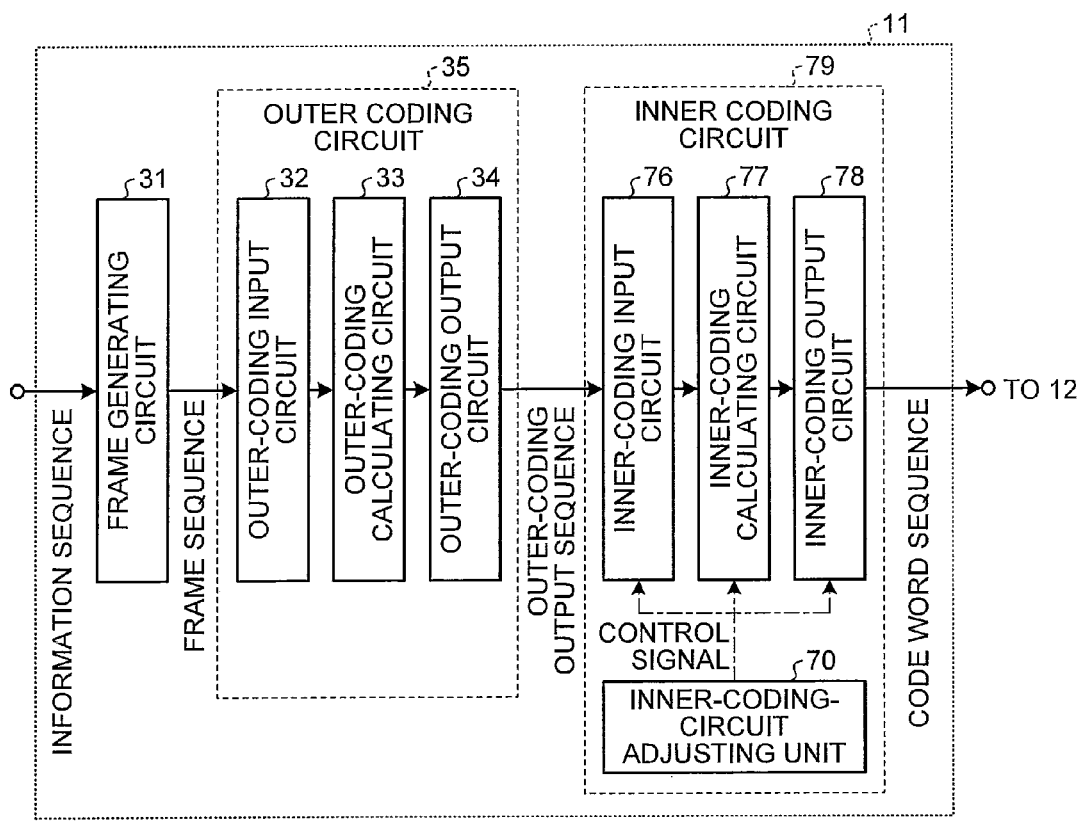
FIG. 7 is a block diagram of a configuration of an error-correction coding apparatus according to a second embodiment of the present invention.

FIG. 7 is a block diagram of another specific configuration example of the error correction encoder 11 shown in FIG. 1. As shown in FIG. 7, the error correction encoder 11 includes the frame generating circuit 31; the outer-coding input circuit 32; the outer-coding calculating circuit 33; the outer-coding output circuit 34; an online-adjustable inner-coding input circuit 76; an online-adjustable inner-coding calculating circuit 77; an online-adjustable inner-coding output circuit 78; and an inner-coding-circuit adjusting unit 70. The outer-coding input circuit 32, the outer-coding calculating circuit 33, and the outer-coding output circuit 34 form the outer coding circuit 35 (coding unit for the outer code). The online-adjustable inner-coding input circuit 76, the online-adjustable inner-coding calculating circuit 77, the online-adjustable inner-coding output circuit 78, and the inner-coding-circuit adjusting unit 70 forms an online-adjustable inner coding circuit 79 (coding unit for the inner code). Like reference numerals as those in FIG. 2 denote like constituent elements as those in FIG. 2. For sake of simplicity, "online-adjustable inner-coding" in the names of the elements related to the online-adjustable inner coding circuit 79 is hereinafter simply referred to as "inner-coding".

Figure 8:
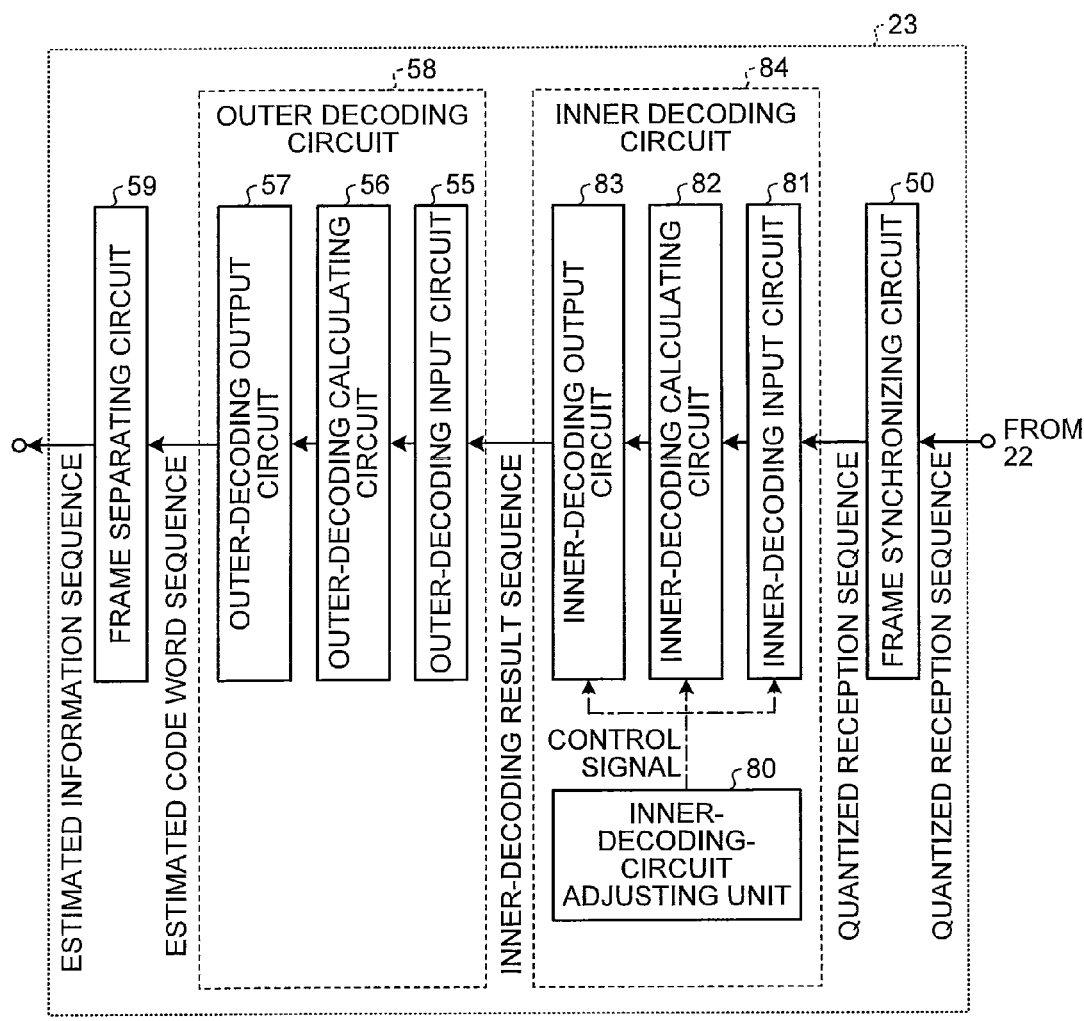
FIG. 8 is a block diagram of a configuration of an error-correction decoding apparatus according to the second embodiment.

FIG. 8 is a block diagram of another specific configuration example of the error correction decoder 23 shown in FIG. 1. As shown in FIG. 8, the error correction decoder 23 includes the frame synchronizing circuit 50, an online-adjustable inner-decoding input circuit 81, an online-adjustable inner-decoding calculating circuit 82, an online-adjustable inner-decoding output circuit 83, the outer-decoding input circuit 55, the outer-decoding calculating circuit 56, the outer-decoding output circuit 57, the frame separating circuit 59, and an inner-decoding-circuit adjusting unit 80. The online-adjustable inner-decoding input circuit 81, the online-adjustable inner-decoding calculating circuit 82, the online-adjustable inner-decoding output circuit 83, and the inner-decoding-circuit adjusting unit 80 forms an online-adjustable inner decoding circuit 84 (decoding unit for the inner code). The outer-decoding input circuit 55, the outer-decoding calculating circuit 56, and the outer-decoding output circuit 57 forms the outer decoding circuit 58 (decoding unit for the outer code). For sake of simplicity, the elements related to the online-adjustable inner decoding circuit 84 is hereinafter simply referred to as "inner-decoding".

While the inner-coding-circuit adjusting unit 70 and the inner-decoding-circuit adjusting unit 80 are each shown as one block in FIGS. 7 and 8, the units 70 and 80 have an online-adjustable function to adjust the error correction capability, which is explained later. The error-correction-capability adjusting function, which is determined at the specification phase as described in the first embodiment, is already provided in the inner coding circuit 79 and the inner decoding circuit 84.

Operations of the error correction encoder 11 and the error correction decoder 23 according to the second embodiment are explained. Only the online-adjustable function to adjust the error correction capability, which is a characteristic of the second embodiment, is explained below.

In the first embodiment, the adjustment on the error correction capability of the inner code has been explained. In the second embodiment, the bit width q and the number i of iterations of the quantized reception sequence, which can be adjusted online, are particularly focused among the adjustment on the error correction capability described above.

The inner-decoding-circuit adjusting unit 80 in FIG. 8 changes a state of the inner decoding circuit 84 according to a control signal from a receiver (not shown) or a control signal on a post-decoding bit error rate from the receiver (not shown) or the frame separating circuit 59. When the post-decoding bit error rate is small, for example, the bit width q of the quantized reception sequence is reduced, or numerical transformation (bit shift or fixed value addition) of the quantized reception sequence is performed based on a dynamic change in the post-decoding bit error rate. In this way, the state of the inner decoding circuit 84 is changed and therefore the error correction capability of the inner code is changed.

Further, the state of the inner decoding circuit 84 is changed by increasing or decreasing the number i of iterations according to a control signal from the receiver or a dynamic change in the post-decoding bit error rate, for example. Accordingly, the error correction capability of the inner code is changed.

Furthermore, when a variable function such as a generating polynomial for various codes, a parity check matrix, or an inner-interleaver generating expression is installed, a condition thereof is changed according to a control signal from the receiver or a dynamic change in the post-decoding bit error rate by using the inner-coding-circuit adjusting unit 70 and the inner-decoding-circuit adjusting unit 80. Thus, states of the inner coding circuit 79 and the inner decoding circuit 84 can be changed and the error correction capability of the inner code can be changed.

As described above, the second embodiment includes the outer coding circuit 35, the online-adjustable inner coding circuit 79, the inner-coding-circuit adjusting unit 70, the online-adjustable inner decoding circuit 84, the outer decoding circuit 58, and the inner-decoding-circuit adjusting unit 80. With this configuration, the inner coding process and the inner decoding process for the inner code having the error correction capability adjusted based on the error correction capability of the outer code can be achieved. Therefore, an increase in the circuit size due to assignment of an excessive error correction capability to the inner code can be avoided. Also, the error correction capability of the inner code can be optimized according to a dynamic change in the communication channel or the like.

Because the outer coding circuit 35, the online-adjustable inner coding circuit 79, and the inner-coding-circuit adjusting unit 70 are included, the inner coding process for the inner code having the error correction capability adjusted online based on the error correction capability of the outer code can be performed. Therefore, an error-correction coding apparatus that can avoid the increase in the circuit size due to assignment of an excessive error correction capability to the inner code and can optimize the error correction capability of the inner code according to a dynamic change in the communication channel or the like can be realized.

Because the online-adjustable inner decoding circuit 84, the outer decoding circuit 58, and the inner-decoding-circuit adjusting unit 80 are included, the inner decoding process for the inner code having the error correction capability adjusted online based on the error correction capability of the outer code can be performed. Therefore, an error-correction decoding apparatus that can avoid the increase in the circuit size due to assignment of an excessive error corrective capability to the inner code and can optimize the error correction capability of the inner code according to a dynamic change in the communication channel or the like can be realized.

According to the present invention, because outer coding of performing a coding process for an outer code and inner coding of performing a coding process for an inner code that has an error correction capability adjusted based on an error correction capability of the outer code are included, the circuit size can be taken into consideration and thus an error-correction coding method having a reduced circuit size can be achieved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An error-correction coding method for achieving a desired bit error ratio (BER) of BERod after error correction of data transmitted via a channel, which has a BER of BERib, the method comprising the steps of:

performing a coding process for an outer code interleaved to a depth of No bits, wherein the outer code has an error correction capability of reducing BER by a difference between BERob and BERod, and wherein BERob represents a BER by which an error correction capability of the outer code is defined; and using an inner coding circuit to perform a coding process for an inner code that has an error correction capability dependent on a parameter of the inner code that is correlated to circuit size implementation of the coding process for the inner code, wherein the inner code has an error correction capability, which is correlated to the parameter of the inner code, of reducing BER by a difference between BERib and BERid, wherein BERid represents a BER by which an error correction capability of the inner code is defined, wherein the error correction capabilities of the inner and outer codes satisfy the following conditions:

BERid is the highest possible value below BERob that can be obtained by adjusting a value of the parameter of the inner code;

$BER_{ob} < BER_{ib}$; and $(L/No) < \text{floor}((d-1)/2)$, where L is the number of residual bit errors which tend to occur per error based on the error correction capability of the inner code, d is a minimum distance representing the error correction capability of the outer code, No is the interleaving depth of the outer code in terms of bits, and floor(x) is a function for deriving a maximum integer not exceeding x, and wherein the circuit size of the inner coding circuit is incapable of supporting the next incremental value of the parameter of the inner code that correlates to a reduction of the BERid.

2. The error-correction coding method according to claim 1, wherein the step of using an inner coding circuit includes adjusting of an inner coding circuit to change the error correction capability of the inner code.

3. An error-correction decoding method for achieving a desired bit error ratio (BER) of BERod after error correction of data transmitted via a channel, which has a BER of BERib, the method comprising the steps of:

performing a decoding process for an outer code interleaved to a depth of No bits, wherein the outer code has an error correction capability of reducing BER by a difference between BERob and BERod, and wherein BERob represents a BER by which an error correction capability of the outer code is defined; and using an inner decoding circuit to perform a decoding process for an inner code that has an error correction capability dependent on a parameter of the inner code that is correlated to circuit size implementation of the decoding process for the inner code, wherein the inner code has an error correction capability, which is correlated to the parameter of the inner code, of reducing BER by a difference between BERib and BERid, wherein BERid represents a BER by which an error correction capability of the inner code is defined, wherein the error correction capabilities of the inner and outer codes satisfy the following conditions:

BERid is the highest possible value below BERob that can be obtained by adjusting a value of the parameter of the inner code;

$BER_{ob} < BER_{ib}$; and $(L/No) < \text{floor}((d-1)/2)$, where L is the number of residual bit errors which tend to occur per error based on the error correction capability of the inner code, d is a minimum distance representing the error correction capability of the outer code, No is the interleaving depth of the outer code in terms of bits, and floor(x) is a function for deriving a maximum integer not exceeding x, and wherein the circuit size of the inner decoding circuit is incapable of supporting the next incremental value of the parameter of the inner code that correlates to a reduction of the BERid.

4. The error-correction decoding method according to claim 3, wherein the step of using an inner decoding circuit includes adjusting of an inner decoding circuit to change the error correction capability of the inner code.

5. An error-correction coding apparatus for achieving a desired bit error ratio (BER) of BERod after error correction of data transmitted via a channel, which has a BER of BERib, the apparatus comprising:

an outer coding circuit that performs a coding process for an outer code interleaved to a depth of No bits, wherein the outer code has an error correction capability of reducing BER by a difference between BERob and BERod, and wherein BERob represents a BER by which an error correction capability of the outer code is defined; and an inner coding circuit that performs a coding process for an inner code that has an error correction capability dependent on a parameter of the inner code that is correlated to circuit size implementation of the coding process for the inner code, wherein the inner code has an error correction capability, which is correlated to the parameter of the inner code, of reducing BER by a difference between BERib and BERid, wherein BERid represents a BER by which an error correction capability of the inner code is defined, wherein error correction capabilities of the inner and outer codes satisfy the following conditions:

BERid is the highest possible value below BERob that can be obtained by adjusting a value of the parameter of the inner code;

$BER_{ob} < BER_{ib}$; and $(L/No) < \text{floor}((d-1)/2)$, where L is the number of residual bit errors which tend to occur per error based on the error correction capability of the inner code, d is a minimum distance representing the error correction capability of the outer code, No is the interleaving depth of the outer code in terms of bits, and floor(x) is a function for deriving a maximum integer not exceeding x, and wherein the circuit size of the inner coding circuit is incapable of supporting the next incremental value of the parameter of the inner code that correlates to a reduction of the BERid.

6. The error-correction coding apparatus according to claim 5, wherein the inner coding circuit includes an inner-coding-circuit adjusting unit that changes the error correction capability of the inner code.

7. An error-correction decoding apparatus for achieving a desired bit error ratio (BER) of BERod after error correction of data transmitted via a channel, which has a BER of BERib, the apparatus comprising:
- an outer decoding circuit that performs a decoding process for an outer code interleaved to a depth of No bits, wherein the outer decoding circuit has an error correction capability of reducing BER by a difference between BERob and BERod, and wherein BERob represents a BER by which an error correction capability of the outer code is defined; and
- an inner decoding circuit that performs a decoding process for an inner code, and has an error correction capability dependent on a parameter of the inner code that is correlated to circuit size implementation of the decoding process for the inner code,
- wherein the inner decoding circuit has an error correction capability, which is correlated to the parameter of the inner code, of reducing BER by a difference between BERib and BERid, wherein BERid represents a BER by which an error correction capability of the inner code is defined,
- wherein error correction capabilities of the inner and outer decoding circuits satisfy the following conditions:
  - BERid is the highest possible value below BERob that can be obtained by adjusting a value of the parameter of the inner code;
  - $BER_{ob} < BER_{ib}$; and
  - $(L/No) < floor((d-1)/2)$,
- where L is the number of residual bit errors which tend to occur per error based on the error correction capability of the inner code, d is a minimum distance representing the error correction capability of the outer code, No is the interleaving depth of the outer code in terms of bits, and floor(x) is a function for deriving a maximum integer not exceeding x, and
- wherein the circuit size of the inner decoding circuit is incapable of supporting the next incremental value of the parameter of the inner code that correlates to a reduction in BERid.

8. The error-correction decoding apparatus according to claim 7, wherein the inner decoding circuit includes an inner-decoding-circuit adjusting unit that changes the error correction capability of the inner code.

* * * * *